(12) United States Patent
De Lange et al.

(10) Patent No.: US 12,733,408 B2
(45) Date of Patent: Sep. 8, 2026

(54) SUPERCONDUCTING QUANTUM INTERFERENCE DEVICES AND USES THEREOF

(71) Applicant: Microsoft Technology Licensing, LLC, Redmond, WA (US)

(72) Inventors: Gijsbertus De Lange, Schiphol (NL); Jaap Joachim Wesdorp, Delft (NL)

(73) Assignee: Microsoft Technology Licensing, LLC, Redmond, WA (US)

( * ) Notice: Subject to any disclaimer, the term of this patent is extended or adjusted under 35 U.S.C. 154(b) by 842 days.

(21) Appl. No.: 18/043,566

(22) PCT Filed: Sep. 18, 2020

(86) PCT No.: PCT/EP2020/076191

§ 371 (c)(1),
(2) Date: Feb. 28, 2023

(87) PCT Pub. No.: WO2022/058025

PCT Pub. Date: Mar. 24, 2022

(65) Prior Publication Data

US 2023/0270019 A1 Aug. 24, 2023

(51) Int. Cl.
*H10N 60/12* (2023.01)
*G06N 10/40* (2022.01)
(Continued)

(52) U.S. Cl.
CPC ............. *H10N 60/12* (2023.02); *G06N 10/40* (2022.01); *H03K 17/92* (2013.01); *H10N 60/128* (2023.02)

(58) Field of Classification Search
CPC ....... H10N 60/12; H10N 60/128; G06N 10/40
See application file for complete search history.

(56) References Cited

U.S. PATENT DOCUMENTS 5,574,290 A 11/1996 You
6,690,162 B1 2/2004 Schopohl et al.
(Continued)

FOREIGN PATENT DOCUMENTS

JP 103156984 A 7/1991
WO 2021219219 A1 11/2021

OTHER PUBLICATIONS

Decision to grant a European patent pursuant to Article 97(1) Received for European Application No. 20776117.2, mailed on May 3, 2024, 02 pages.

(Continued)

*Primary Examiner* — Paul A Wartalowicz
(74) *Attorney, Agent, or Firm* — Alleman Hall LLP

(57) ABSTRACT

A system comprises a substrate having a planar surface; a first magnet configured to apply a first magnetic field parallel to the planar surface; a circuit arranged on the planar surface; and a superconducting quantum interference device, SQUID, operably linked to the circuit. The SQUID comprises a Josephson junction arranged in a superconductive loop. The superconductive loop includes a portion which extends perpendicular to the planar surface and is orientated such that the SQUID is tuneable by the first magnet. By allowing the SQUID to be tuned using a magnetic field which is parallel to the planar surface, a reduction in flux noise may be achieved. Also provided are a method of operating a SQUID, and a SQUID.

20 Claims, 8 Drawing Sheets

(51) Int. Cl.
*H03K 17/92* (2006.01)
*H10N 60/10* (2023.01)

(56) References Cited

U.S. PATENT DOCUMENTS

| | | | | |
|---|---|---|---|---|
| 6,908,771 | B2 | 6/2005 | Lee et al. | |
| 10,078,118 | B2 | 9/2018 | Berggren et al. | |
| 10,586,911 | B1 | 3/2020 | Sandberg et al. | |
| 10,615,223 | B2 | 4/2020 | Rosenblatt et al. | |
| 2019/0044051 | A1 | 2/2019 | Caudillo et al. | |
| 2019/0164077 | A1 | 5/2019 | Roberts et al. | |
| 2019/0341668 | A1 * | 11/2019 | White | H10N 60/0241 |
| 2020/0119254 | A1 | 4/2020 | Jinka et al. | |
| 2022/0263468 | A1 * | 8/2022 | Yamamoto | H03B 15/003 |

OTHER PUBLICATIONS

Korean Intellectual Property Office, Office Action Received for Korea Application No. 10-2023-7008672, mailed on Oct. 21, 2024, 7 pages.
"Squid", Retrieved from: https://en.wikipedia.org/wiki/SQUID, Jan. 7, 2019, 6 Pages.
Bargerbos, et al., "Observation of Vanishing Charge Dispersion of a Nearly Open Superconducting Island", In repository of arXiv:1911.10010v3, Feb. 28, 2020, 12 Pages.
Blais, et al., "Circuit Quantum Electrodynamics", In repository of arXiv:2005.12667v1, May 26, 2020, 82 Pages.
Burkard, et al., "Superconductor-Semiconductor Hybrid Cavity Quantum Electrodynamics", In Journal of Nature Reviews Physics, Jan. 29, 2020, 25 Pages.
Fagaly, RL., "Superconducting Quantum Interference Device Instruments and Applications", In Journal of Review of Scientific Instruments, vol. 77, Issue 10, Oct. 11, 2006, 46 Pages.
Hays, et al., "Continuous Monitoring of a Trapped, Superconducting Spin", In repository of arXiv:1908.02800v1, Aug. 7, 2019, 28 Pages.
Hays, et al., "Direct Microwave Measurement of Andreev-Bound-State Dynamics in a Proximitized Semiconducting Nanowire", In repository of arXiv:1711.01645v1, Nov. 5, 2017, 8 Pages.
Huber, et al., "Gradiometric micro-SQUID susceptometer for scanning measurements of mesoscopic samples", In Journal of Review of Scientific Instruments, vol. 79, Issue 5, May 28, 2008, 8 Pages.
Janvier, et al., "Coherent Manipulation of Andreev States in Superconducting Atomic Contacts", In repository of arXiv:1509.03961v1, Sep. 14, 2019, 25 Pages.
Kringhøj, et al., "Suppressed Charge Dispersion via Resonant Tunneling in a Single-Channel Transmon", In repository of arXiv:1911.10011v2, Nov. 26, 2019, 10 Pages.
Kroll, et al., "Magnetic-Field-Resilient Superconducting Coplanar-Waveguide Resonators for Hybrid Circuit Quantum Electrodynamics Experiments", In repository of arXiv:1809.03932v1, Sep. 11, 2018, 8 Pages.
Ange, et al., "Realization Of Microwave Quantum Circuits Using Hybrid Superconducting-Semiconducting Nanowire Josephson Elements", In repository of arXiv:1503.08483v1, Mar. 29, 2015, 15 Pages.
Majer, et al., "Simple Phase Bias for Superconducting Circuits", In repository of arXiv:cond-mat/0112433v2, Jan. 22, 2002, 5 Pages.
"International Search Report and Written Opinion Issued in PCT Application No. PCT/EP20/076191", Mailed Date: Jun. 2, 2021, 13 Pages.
Plugge, et al., "Majorana Box Qubits", In repository of arXiv:1609.01697v2, Dec. 21, 2016, 11 Pages.
Samkharadze, et al., "High-Kinetic-Inductance Superconducting Nanowire Resonators for Circuit QED in a Magnetic Field", In repository of arXiv:1511.01760v1, Nov. 5, 2015, 10 Pages.
Stanescu, et al., "Majorana Fermions in Semiconductor Nanowires", In repository of arXiv:1106.3078v2, Nov. 16, 2011, 32 Pages.
Tinkham, Michael, "Introduction to Superconductivity", Published by Courier Corporation, Jan. 1, 2004, 1 Page.
Tosi, et al., "Spin-Orbit Splitting of Andreev States Revealed by Microwave Spectroscopy", In repository of arXiv:1810.02591v2, Dec. 13, 2018, 13 Pages.
Vayrynen, et al., "Microwave Signatures of Majorana States in a Topological Josephson Junction", In repository of arXiv:1504.03680v1, Apr. 14, 2015, 21 Pages.
Vidal, et al., "A gate-tunable, field-compatible fluxonium", In Repository of arXiv:1910.07978, Oct. 17, 2019, 12 Pages.
Wendin, G, "Quantum Information Processing with Superconducting Circuits: A Review", In repository of arXiv:1610.02208v2, Oct. 8, 2017, 108 Pages.
Winkler, et al., "A Unified Numerical Approach to Topological Semiconductor-Superconductor Heterostructures", In repository of arXiv:1810.04180v2, Jul. 8, 2019, 16 Pages.
Luthi, et al., "Evolution of Nanowire Transmon Qubits and Their Coherence in a Magnetic Field", In Journal of Physical Review Letters, vol. 120, Issue 10, Mar. 9, 2018, 6 Pages.

* cited by examiner

SUPERCONDUCTING QUANTUM INTERFERENCE DEVICES AND USES THEREOF

CROSS REFERENCE TO RELATED APPLICATIONS

The present application is a U.S. National Phase of International Patent Application Serial No. PCT/EP2020/076191 entitled "Superconducting Quantum Interference Devices and Uses Thereof", filed Sep. 18, 2020, the entire content of which is hereby incorporated by reference for all purposes.

BACKGROUND

Superconducting circuits are used in quantum computer devices, as well as in quantum science and technology more generally. Such circuits may be sensitive to magnetic fields. Both static and time-varying magnetic fields can introduce noise, thereby degrading the performance of the circuit.

Operating certain superconducting circuits involves the use of a magnetic field to tune the behaviour of the circuit. This is referred to as flux tuning. Flux tuning may be useful for devices such as superconducting qubits, Josephson junction-based parametric amplifiers, and superconducting quantum interference device ("SQUID") magnetometers.

Typically, a relatively weak magnetic field, e.g. one having a strength of the order of 1 to 100 μT depending on the area enclosed by the loop of the SQUID, is used for flux tuning. Background flux noise may be suppressed by adding multiple layers of magnetic and superconducting shielding. The shielding may be local shielding, i.e. the device may be arranged in a relatively small sample container encapsulated in mu-metal shielding and arranged in the cryogenic chamber. Flux tuning can then be performed by local flux bias lines or a small coil inside the shielding.

Local shielding is suitable for devices operating in zero field but is impractical for devices which require a strong magnetic field. It is not possible to generate a strong field using a small coil inside the shielding.

Certain superconducting circuits may require the use of a relatively strong magnetic field, e.g. of the order of 100 mT to several Tesla, in order to operate. For example, a strong magnetic field may be necessary for introducing topological behaviour in a device comprising a semiconductor-superconductor hybrid structure, such as a topological qubit. Topological behaviour refers to a particular type of excitation, referred to as Majorana zero modes, which may be induced when a semiconductor undergoes energy level hybridisation with a superconductor. The magnetic field is used to lift spin degeneracy in the device, in other words to cause different spin states to have different energy levels. A more detailed discussion of hybrid devices is provided in Stanescu et al (Physical Review B 84, 144522 (2011)) and Winkler et al (Physical Review B 99, 245408 (2019)).

Local shielding of a superconducting circuit is not a practical approach to reducing noise in a superconducting circuit operated in a strong magnetic field. The use of large multilayer shields around the complete experimental setup combined with Helmholtz coils to compensate for external magnetic flux has been proposed. An alternative approach has been the use of gradiometric circuit designs. In gradiometric designs there is a trade-off between noise sensitivity and flux tunability. There is an upper limit on the out of plane field strength a thin-film superconducting circuit can tolerate. If the magnetic field is too strong, static and time varying vortex currents are induced, which induce additional noise in the form of increased dissipation, inductive noise, and flux noise.

SUMMARY

In one aspect, there is provided a system comprising: a substrate having a planar surface; a first magnet configured to apply a first magnetic field parallel to the planar surface; a circuit arranged on the planar surface; and a superconducting quantum interference device, SQUID, operably linked to the circuit; wherein the SQUID comprises a Josephson junction arranged in a superconductive loop; and wherein the superconductive loop includes a portion which extends perpendicular to the planar surface and is orientated such that the SQUID is tuneable by the first magnet. By allowing the SQUID to be tuned using a magnetic field which is parallel to the planar surface, a reduction in flux noise may be achieved.

In another aspect, there is provided a method of operating a superconducting quantum interference device, SQUID, wherein the SQUID is operably linked to a circuit arranged on a planar surface of a substrate, wherein the SQUID comprises a Josephson junction arranged in a superconductive loop, and wherein the superconductive loop includes a portion which extends perpendicular to the planar surface, the method comprising: cooling the SQUID to an operating temperature; and tuning the SQUID by applying a first magnetic field in a direction parallel to the planar surface and through the superconductive loop. By using a parallel field to tune the SQUID, the effects of flux noise may be reduced.

A still further aspect provides a superconducting quantum interference device, SQUID, wherein the SQUID is arranged on a substrate and comprises: a Josephson junction arranged in a superconductive loop; and a support member having a top surface and a bottom surface; wherein the superconductive loop comprises a bottom portion arranged between a planar surface of the substrate and a bottom surface of the support member, a top portion arranged on a top surface of the support member, and two connecting portions connecting the bottom portion and the top portion, wherein the connecting portions extend in a direction perpendicular to the planar surface of the substrate. The SQUID is insensitive to a magnetic field perpendicular to the substrate, because the superconductive loop is orientated vertically with respect to the substrate and there is no loop in the plane of the substrate. This allows for tuning of the SQUID using a magnetic field which is parallel to the substrate.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Nor is the claimed subject matter limited to implementations that solve any or all of the disadvantages noted herein.

BRIEF DESCRIPTION OF THE DRAWINGS

To assist understanding of embodiments of the present disclosure and to show how such embodiments may be put into effect, reference is made, by way of example only, to the accompanying drawings in which:

FIGS. 1 to 6 are schematic, and are not to scale. The relative proportions of components shown in these FIGS. may be exaggerated for ease of representation.

DETAILED DESCRIPTION OF EMBODIMENTS

Figure 1:
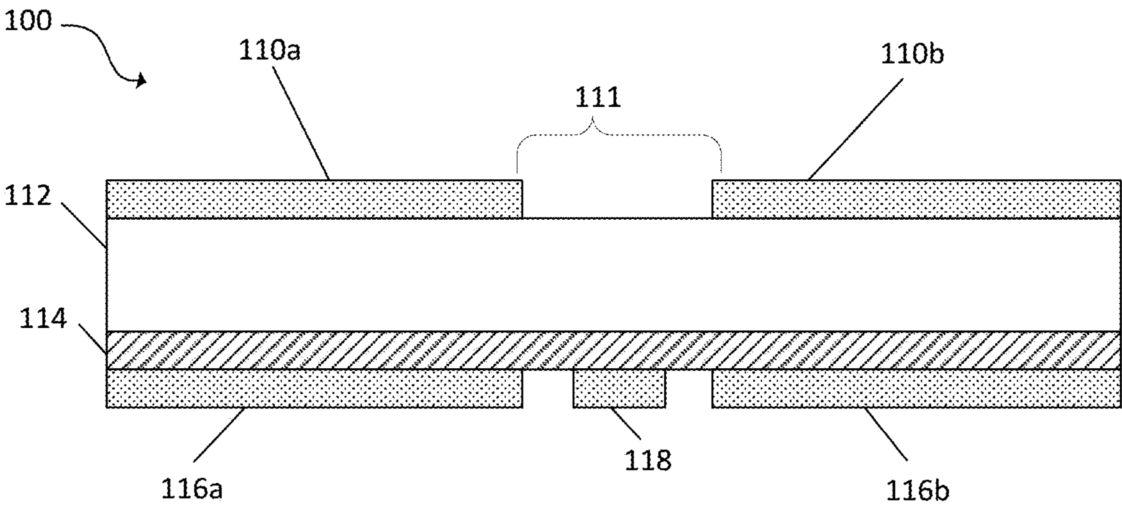
FIG. 1 is a cross-section of an electrostatically gated Josephson junction.

As used herein, the verb 'to comprise' is used as shorthand for 'to include or to consist of'. In other words, although the verb 'to comprise' is intended to be an open term, the replacement of this term with the closed term 'to consist of' is explicitly contemplated, particularly where used in connection with chemical compositions.

Directional terms such as "top", "bottom", "left", "right", "above", "below", "horizontal" and "vertical" are used herein for convenience of description and relate to the device in the orientation shown in the drawings. For the avoidance of any doubt, this terminology is not intended to limit the orientation of the device in an external frame of reference.

The x, y, and z directions referred to herein are Cartesian axes defined relative to the planar surface of the substrate. The y direction is perpendicular to the planar surface. The x and z directions are parallel to the planar surface. The axes are illustrated in each of FIGS. 3A, 4A, and 5A.

Geometric terms such as "parallel" and "perpendicular" are used for convenience of description. In practice, manufacturing and operating tolerances will apply.

As used herein, the terms "superconductor", "superconductive", and the like are used to refer to a material or component which displays superconductive behaviour when cooled to an operating temperature below the critical temperature, Tc, of the component. The use of these term is not intended to limit the temperature of the device when not in use.

A "nanowire" is an elongate member having a nano-scale width, and a length-to-width ratio of at least 100, or at least 500, or at least 1000. A typical example of a nanowire has a width in the range 10 to 500 nm, optionally 50 to 100 nm or 75 to 125 nm. Lengths may be of the order of micrometres, e.g. at least 1 μm, or at least 10 μm.

A "semiconductor-superconductor hybrid structure" comprises a semiconductor component and a superconductor component which may become coupled to one another under certain operating conditions. In particular, this term refers to a structure capable of showing topological behaviour such as Majorana zero modes, or other excitations useful for quantum computing applications. The operating conditions generally comprise cooling the structure to a temperature below the Tc of the superconductor component, applying a magnetic field to the structure, and applying electrostatic gating to the structure. Generally, at least part of the semiconductor component is in intimate contact with the superconductor component, for example the superconductor component may be epitaxially grown on the semiconductor component. Certain device structures having one or more further components between the semiconductor component and superconductor component have also been proposed.

The content of all documents cited herein is hereby incorporated by reference in its entirety.

Superconducting circuits are typically fabricated from a thin film of superconductor material arranged on a substrate having a planar surface. Past approaches to the flux tuning of superconducting circuits have relied upon the use of a magnetic field applied perpendicular to the planar surface. Provided herein are systems and superconducting quantum interference devices that may be tuned using a magnetic field which is parallel to the planar surface. It has been found that superconducting circuits have much greater tolerance to parallel magnetic fields than to perpendicular magnetic fields. Since the superconducting circuit is fabricated from a thin film, the effective surface area of a superconducting circuit parallel to the plane is typically much smaller than the effective surface area perpendicular to the plane.

The systems, devices, and methods provided herein are based on superconducting quantum interference devices, abbreviated herein as "SQUID". A SQUID comprises one or more Josephson junctions arranged in a superconducting loop. The examples described herein use a radio frequency, RF, SQUID including a single Josephson junction. It is believed that the principals explained herein are applicable to any type of SQUID. For example, direct current, DC, SQUIDs comprising two or more Josephson junctions may alternatively be used.

An example of a Josephson junction device 100 will first be described with reference to FIG. 1.

A Josephson junction comprises two superconductive electrodes 110*a*, 110*b* which are separated from one another by a so-called weak link. The weak link provides an energy barrier between the superconductive electrodes 110*a*, 110*b*. A supercurrent may flow between the electrodes were 110*a*, 110*b* by quantum tunnelling through the energy barrier. There is an upper limit on the magnitude of the supercurrent which can bridge the junction can support. This is referred to as the critical current, $I_c$.

A weak link may be implemented in various ways. For example, the weak link may be an insulating layer or portion of normal conductor arranged between the two superconductive electrodes. Another possible implementation of a weak link is a constriction in an otherwise continuous superconducting electrode.

In the example device 100, superconducting electrodes 110*a*, 110*b* are arranged on a nanowire 112 of semiconductor material and are spaced from one another by a gap 111. Semiconductor material in the region of the gap 111 acts as the weak link.

The nature of the superconductor material is not particularly limited and may be selected as appropriate. The superconductor is typically an s-wave superconductor. Any of the various s-wave superconductors known the art may be used. Examples include aluminium, indium, tin, and lead. In implementations where aluminium is used, the superconducting electrodes 110*a*, 110*b* may for example have a thickness in the range 4 to 10 nm, e.g. about 6 nm.

Further examples of superconductor materials include MoRe, TiN and NbTiN. These materials have relatively high upper critical magnetic fields, and in other words remain superconductive in relatively strong magnetic fields. For example, the critical magnetic field of MoRe is greater than 8 T. These materials may be particularly preferred in implementations where strong magnetic fields are to be used.

The semiconductor may comprise a III-V semiconductor material, for example a material of Formula 1:

$$InAs_xSb_{1-x} \quad \text{(Formula 1)}$$

where x is in the range 0 to 1. In other words, the semiconductor component 112 may comprise indium antimonide (x=0), indium arsenide (x=1), or a ternary mixture comprising 50% indium on a molar basis and variable proportions of arsenic and antimony ($0<x<1$).

Another class of useful semiconductor materials are II-VI semiconductor materials. Examples of II-VI semiconductor materials include lead telluride and tin telluride.

FIG. 1 further illustrates a gate stack comprising a set of gate electrodes 116, 118 and a gate dielectric 114. The gate stack is arranged below the nanowire. The gate stack may be positioned between the nanowire 112 and the surface of a substrate.

Gate dielectric 114 serves to prevent a flow of current between the nanowire 112 and the gate electrodes 116, 118. The nature of the gate dielectric is otherwise not particularly limited. Illustrative examples of dielectric materials include aluminium oxide, hafnium oxide, silicon oxides, and silicon nitrides.

The gate electrodes are for tuning the properties of the semiconductor based on the field-effect. In the example shown in FIG. 1, the gate electrodes include a pair of plunger gates 116*a*, 116*b* and a cutter gate 118. Each plunger gate is arranged under a respective one of the superconducting electrodes 110*a*, 110*b* and is spaced from the superconducting electrodes 110*a*, 110*b* by the gate dielectric 114 and the nanowire 112. Cutter gate 118 is arranged between the plunger gates 116*a*, 116*b* and aligned with the gap 111.

Various modifications may be made to the illustrative gate stack shown in FIG. 1. The number and arrangement of the gate electrodes may be selected as desired depending on the use case. The illustrated example is bottom-gated. Top- and side-gated arrangements are also contemplated. In a side-gated device, gate dielectric 114 comprise an empty space as an alternative or in addition to a layer of material.

In use, the behaviour of a Josephson junction is determined by two key parameters. The first of these is the size of the energy barrier. The other is the difference in the phases of the wave functions which describe the superconductivity in the two superconductive electrodes.

Electrostatic gating allows for control over the height of the energy barrier. When the Josephson junction is arranged in a superconductive loop of a SQUID, the phase difference may be controlled by applying magnetic flux through the loop.

FIG. 1 is one illustrative example of a Josephson junction device, and many other implementations are possible. In particular, the use of electrostatic gating is optional. The precise nature of the Josephson junctions used in the systems and devices provided herein is not particularly limited.

Figure 2:
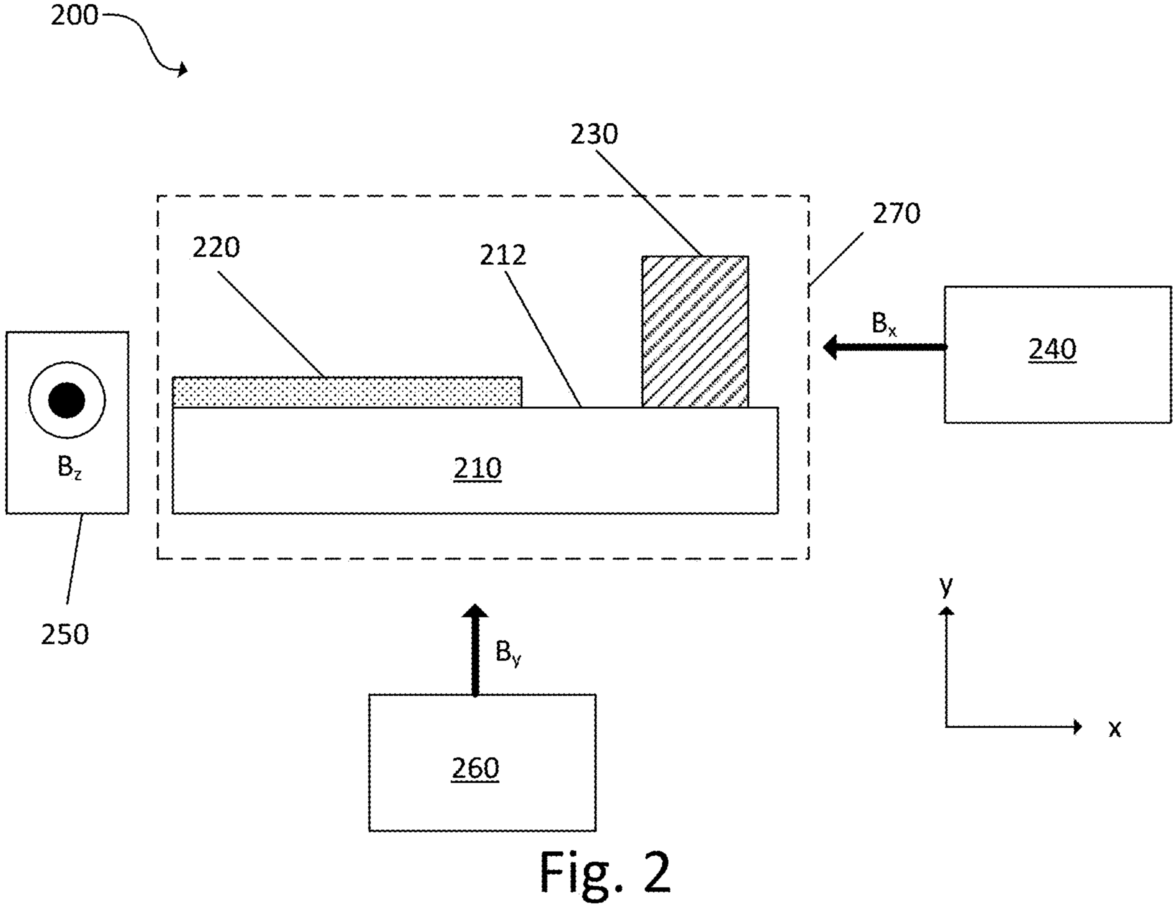
FIG. 2 is a simplified schematic of a system according to the present disclosure.

An example system of the present disclosure will now be described with reference to FIG. 2. FIG. 2 shows a simplified block diagram of the system.

System 200 includes a circuit 220 arranged on a planar surface 212 of a substrate 210. Also arranged on the substrate is a SQUID 230.

The substrate 210 typically comprises a wafer of semiconductor material. A wafer is a single crystalline piece of material. One example wafer material is indium phosphide, which is a high band-gap semiconductor. Other examples of wafer materials include gallium arsenide, indium antimonide, indium arsenide, and silicon (e.g., high resistivity silicon or P-doped silicon).

The substrate may consist of the wafer or may further include additional structures arranged on or over a wafer. For example, the substrate may include layers of two or more materials.

The substrate has a planar surface 212 on which the circuit 220 is arranged. The inclusion of components which are grown epitaxially on the substrate, such as selective-area-grown semiconductor components, is contemplated. Trenches in, or mesas on, the surface of the substrate may be present in some implementations.

The nature of circuit 220 is not particularly limited. Circuit 220 may comprise a superconducting circuit. A superconducting circuit is one which includes at least one superconductor component, and may further include normally conductive components and/or semiconductor components. An example circuit 220 is a qubit device. Circuit 220 may include a semiconductor-superconductor hybrid device.

In particular, circuit 220 may include a superconductive ground plane. A superconductive ground plane is a layer of superconductive material configured to provide electrical grounding. Typically, a superconductive ground plane covers a majority of the surface of the substrate, for example 60% or more, or 75% or more of surface 212. Circuits including such ground planes may be particularly susceptible to the effects of perpendicular magnetic fields due to the ground plane's relatively large surface area. Induced currents in the ground plane are believed to be a significant source of flux noise in superconducting circuits.

The ground plane may include defect sites configured to trap vortex currents. The defect sites may comprise holes having a diameter selected to be smaller than the diameter of the vortices. Such defect sites are described in Kroll et al., *Phys. Rev. Applied* 11, 064053 (2019). The inclusion of defect sites may help to reduce noise.

To fabricate a circuit 220, surface 212 of substrate 210 may be coated with a layer of superconductor material, and the layer may be patterned, for example by etching, to form components of the circuit.

A SQUID 230 is operably linked to the circuit 220. The SQUID 230 comprises a Josephson junction arranged in a superconducting loop. The SQUID 230 may be galvanically connected to the circuit 220 or may be inductively coupled to the circuit 220.

The circuit 220 may comprise an LC resonator circuit. The SQUID may be embedded in the LC resonator circuit. In such implementations, the SQUID provides a non-linear inductance to the LC resonator circuit. The LC resonator circuit may be comprised in a transmon qubit device, fluxonium qubit device, or other superconducting qubit device.

The LC resonator circuit may be connected to a frequency generator. This allows the SQUID to be monitored by monitoring the complex valued microwave response of the LC resonator circuit.

Examples of circuits comprising a combination of a SQUID and resonator circuit, as well as the functions of such circuits, are described in e.g. Tinkham, "Introduction to Superconductivity ($2^{nd}$ Edition)", Dover Publications Inc, 2004, pp. 230; and Fagaly, "Superconducting quantum interference device instruments and applications", Review of Scientific Instruments 77, 101101 (2006).

Further examples of superconducting circuits are described in e.g. Wendin, "Quantum information processing with superconducting circuits: a review", Rep. Prog. Phys. 80, 106001 (2017) (arXiv:1610.02208v2); Blais et al, "Circuit Quantum Electrodynamics", arXiv:2005.12667v1 [quant-ph]; and Burkard et al, "Superconductor-semiconductor hybrid cavity quantum electrodynamics" Nature Reviews Physics (2020) (arXiv:1905.01155v1 [cond-mat.mes-hall]).

The superconductive loop of SQUID 230 extends vertically from the planar surface 212 of the substrate 210. The loop is defined in the yz plane. Illustrative examples of suitable SQUIDs are discussed below with reference to FIGS. 3 to 6.

The system further comprises three magnets 240, 250 and 260. The magnets are configured to apply magnetic fields in an x direction, a y direction, and a z direction, respectively. The y direction is perpendicular to the planar surface 212 of the substrate 210. The x and z directions are each parallel to the planar surface 212 and mutually perpendicular.

The first magnet 240 is configured to apply a first magnetic field $B_x$ in an x direction, i.e. through the loop of the SQUID 230. First magnet 240 is useful for flux tuning of the SQUID. The magnetic field applied by first magnet 240 $B_x$ may have a static component, providing an offset, and a variable component, providing the tuning.

The second magnet 250 configured to apply a second magnetic field $B_z$ in the z direction. The magnetic field applied in the z direction is parallel to the plane of the substrate, but does not pass through the loop of SQUID 230. The flux applied in the z direction does not therefore vary the tuning of the SQUID 230, and in this sense the SQUID is not sensitive to the second magnetic field $B_z$. The second magnet 250 is useful in implementations where it is desired to apply a further magnetic field for operating one or more components of the circuit. The flux applied in the z direction may alter the properties of the Josephson junction itself, which may be useful for inducing topological behaviour or for studying the effects of the magnetic field in the z direction on the Josephson junction.

The third magnet 260 is configured to apply a third magnetic field By in the y-direction, i.e. perpendicular to the planar surface of the substrate. This may be useful for operating components of certain superconductive circuits.

The strengths of the first, second and third magnetic fields may be selected as appropriate depending on the configuration of the SQUID and the nature of the circuit. For example, the strength of the first magnetic field may be selected based on the area enclosed by the superconductive loop of the SQUID.

The first, second and third magnets 240, 250, 260 may each independently be any appropriate type of magnet, and are typically electromagnets. The first magnet is typically configured to generate an adjustable strength magnetic field. The second magnet may also be configured to generate an adjustable strength magnetic field. The third magnet may be configured to generate a constant strength magnetic field or an adjustable strength magnetic field.

In use, substrate 210, circuit 220, and SQUID 230 are arranged in a cryogenic chamber 270, for cooling the circuit 220 and SQUID 230 to an operating temperature. The first, second and/or third magnets 240, 250 and 260 may also be arranged within the cryogenic chamber 270 in certain implementations. In such implementations, the circuit 220 and magnets may be cooled to different extents. For example, the circuit 220 and SQUID 230 may be cooled to a temperature of the order of 30 mK by a dilution stage of the cryogenic chamber, with the magnets 240, 250, 260 being cooled to a temperature of the order of 3 K by pulse tubes of the cryogenic chamber.

A magnetic field for tuning the SQUID is applied using the first magnet. The strength of this magnetic field may be adjusted to cause the SQUID to behave in a desired way.

Magnetic fields for operating one or more components of the circuit and/or varying the properties of the Josephson junction may be applied using the second and/or third magnet. The magnetic field $B_z$ applied by the second magnet may be varied without inducing significant flux noise, because this field is parallel to the planar surface of the substrate. A further magnetic field By may be applied perpendicular to the planar surface by the third magnet. Any variations in the By field are preferably minimized when measuring the signal generated by the SQUID.

Since the superconductive loop of the SQUID 230 is arranged in the yz plane, flux tuning of the SQUID 230 by applying magnetic field $B_x$ parallel to the planar surface of the substrate 210 and through the loop of the SQUID is made possible. It is then no longer necessary to use a perpendicular field for flux tuning. Variations in the perpendicular field may generate vortex currents or rearranging supercurrents, resulting in high flux noise. As demonstrated in the Example, the inventors have found that using a parallel field for tuning results in significantly less flux noise.

Further, as will be explained in more detail below, the effective area enclosed by the superconductive loop of the SQUID may also be reduced. It is relatively straightforward, using current fabrication methods, to achieve small vertical spacings between components. Minimum component sizes and spacings in the plane of the substrate are much more constrained. By reducing the area enclosed by the superconductive loop, less flux may be coupled into the loop and noise may therefore be further reduced.

Various modifications to the example system are possible. For example, the second and third magnets are optional, and either or both of these magnets may be omitted in some implementations. It should be appreciated that the labels "second" and "third" are arbitrary labels for ease of discussion. Implementations which include the third magnet but omit the second magnet are contemplated.

As described in more detail with reference to FIG. 5, if the superconductive loop further comprises a gradiometer in the plane of the substrate, then full decoupling of flux noise in the Y-direction is made possible. Such a SQUID has improved tolerance to variations in the perpendicular magnetic field, while remaining flux tuneable using a parallel field in the x direction.

Figures 3A, 3B, 3C:
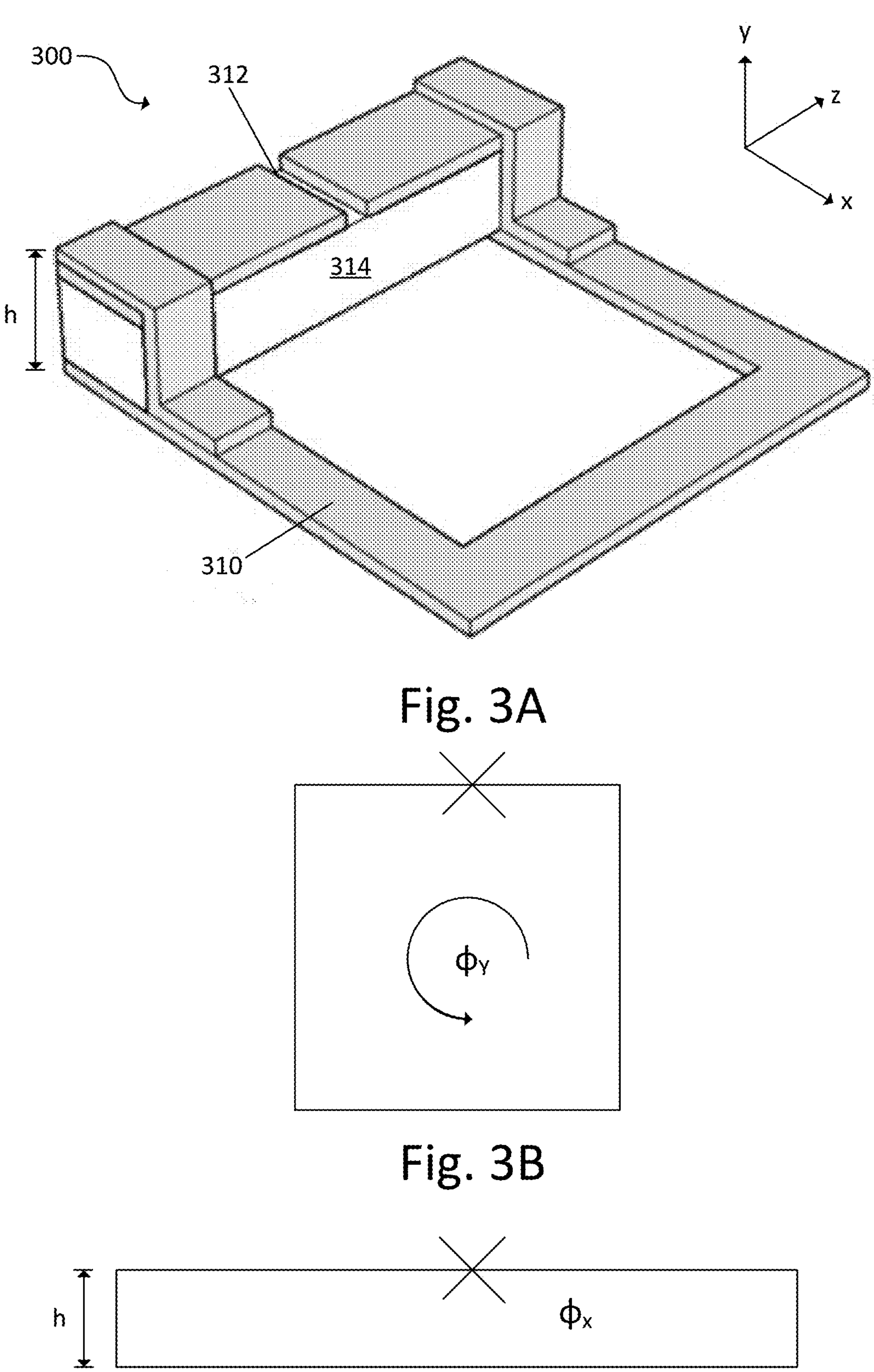
FIGS. 3A to 3C illustrate a first example of a SQUID, and are respectively a perspective view, plan view, and side view in the yz plane.

A first example of a SQUID 300 useful in system 200 is shown in FIGS. 3A to 3C. FIG. 3A shows a perspective view of the SQUID 300. FIG. 3B shows a plan view of the SQUID 300, in the xz plane. FIG. 3C shows a side view of the SQUID 300, in the yz plane. The xz plane is the plane of the substrate. The y direction is the direction perpendicular to the surface of the substrate.

SQUID 300 is a radio frequency, RF, SQUID comprising a superconducting loop 310 interrupted by a single Josephson junction 312. One part of the superconducting loop 310 is spaced vertically from the plane of the substrate by a height h, in this example by a layer of dielectric material 314.

FIG. 3B shows a projection of the SQUID 300 in the xz plane. As may be seen, a loop is present in this plane. Any magnetic flux $\phi_y$ applied perpendicular to the plane of the substrate in the y-direction will coupled into the loop. The SQUID of this example therefore remains sensitive to a magnetic field applied in the y-direction. SQUID 300 is suitable for use in systems that do not include a second magnet 260 for applying a magnetic field perpendicular to the plane of the substrate. The SQUID 300 may be coupled to other components of a circuit via the loop in the xz plane.

FIG. 3C shows a projection in the yz plane. As may be seen, since a portion of the superconducting loop 310 is suspended over the substrate, there is an effective loop in the yz plane. Therefore, magnetic flux $\phi_x$ applied in the x-direction, parallel to the plane of the substrate, may be used to tune behaviour of the Josephson junction. No perpendicular field is required for tuning.

One of the parameters which determines the area of the loop in the yz plane is the height h of the loop 310. This height may be varied by controlling the thickness of the dielectric layer. It is possible to fabricate dielectric layers having a wide range of thicknesses using currently available techniques. For example, the dielectric layer may have a thickness in the range 5 nm to 100 nm, e.g. 20 to 30 nm. Layers having a thickness of less than 5 nm are possible, e.g. by fabricating a boron nitride monolayer by exfoliation. There is no particular upper limit on dielectric layer thickness.

The area enclosed by the loop may therefore be selected as desired by adjusting the thickness of the dielectric layer. In some implementations, it may be useful to providing a loop having a small area, in order to reduce sensitivity to flux noise. By way of comparison, a typical minimum spacing between metal components fabricated on the surface of a planar substrate is of the order 50 nm due to fabrication constraints.

Various modifications to the described SQUID are possible.

A gate stack for electrostatically gating the Josephson junction may be included.

The part of the superconducting loop which is spaced vertically from the plane of the substrate does not necessarily need to include the Josephson junction as illustrated in FIG. 3A. If desired, depending on the form of Josephson junction used, the Josephson junction may be directly on the substrate.

In the illustrated example, the vertical spacing is achieved using a dielectric layer. Other techniques are possible. For example, the Josephson junction, or a part of the superconducting loop, may be arranged on a nanowire.

The Josephson junction may be provided by a device of the type described above with reference to FIG. 1.

Figures 4A, 4B, 4C:
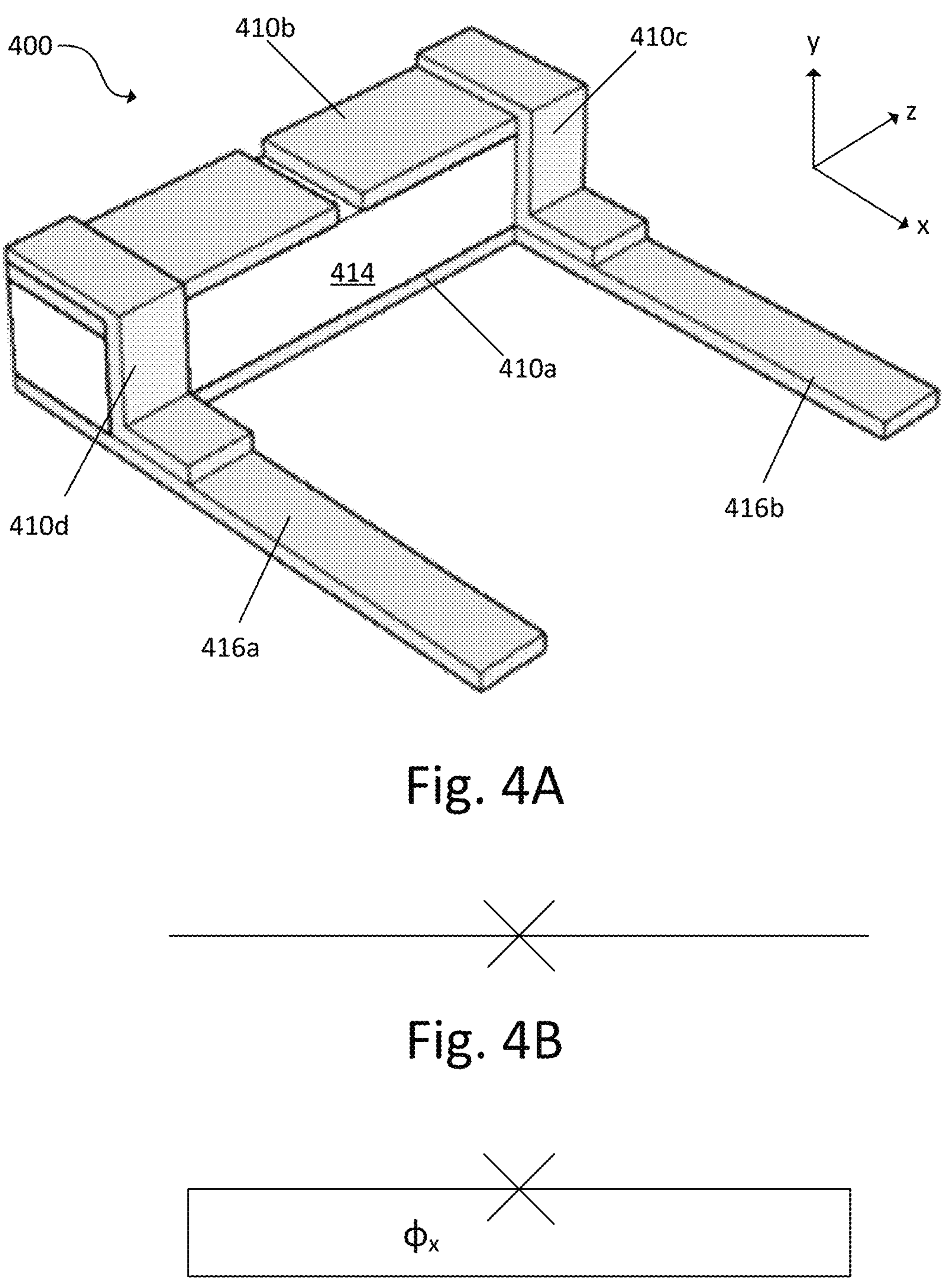
FIGS. 4A to 4C illustrate a second example of a SQUID, and are respectively a perspective view, plan view, and side view in the yz plane.

A second example of a SQUID 400 is illustrated in FIGS. 4A to 4C. FIG. 4A shows a perspective view of the SQUID 400. FIG. 3B shows a plan view of the SQUID 400, in the xz plane. FIG. 3C shows a side view of the SQUID 400, in the yz plane.

SQUID 400 differs from SQUID 300 principally in that the superconductive loop 410 is arranged vertically, and there is no loop in the plane of the substrate. SQUID 300 is therefore insensitive to magnetic fields in the y-direction, or in other words the tuning of SQUID 300 is not affected by a magnetic field applied in the y-direction. A magnetic field in the y-direction may however change the properties of the Josephson junction of the SQUID.

Superconductive loop 410 includes a bottom part 410*a* arranged on the substrate; a top part 410*b* arranged over and vertically spaced from the bottom part 410*a*, and two vertical parts 410*c*, 410*d* which connect the top and bottom parts 410*a*, 410*b*. The top part 410*b* is supported by dielectric layer 414.

SQUID 400 further includes transmission lines 416*a*, 416*b* for linking the SQUID 400 to other components of a circuit.

As shown in FIG. 4B, the SQUID 400 does not include a loop in the xz plane. The SQUID 400 therefore has no sensitivity to flux applied perpendicular to the substrate. SQUID 400 is therefore compatible with strong perpendicular fields. SQUID 400 may be immune to flux noise in the y and z directions.

FIG. 4C illustrates that a loop is present in the yz plane. Thus, the SQUID 400 remains tuneable using a magnetic field applied parallel to the surface of the substrate.

As with SQUID 300, various modifications to SQUID 400 are possible. Dielectric layer 414 may be replaced by a nanowire, or a combination of a nanowire and a dielectric layer. The Josephson junction may be arranged on the surface of the substrate, or in one of the vertical parts of the superconducting loop, as an alternative to being arranged in the top part of the loop as illustrated.

SQUID 400 may be modified to allow for electrostatic gating by using a semiconductor in place of dielectric layer 414 and by configuring the gate stack as a side-gate, spaced horizontally from the semiconductor. The gate electrode in such an example may be formed of a normal conductor, or a superconductive electrode which is configured not to shield the whole area of the vertical loop from the magnetic field.

Figure 5A:
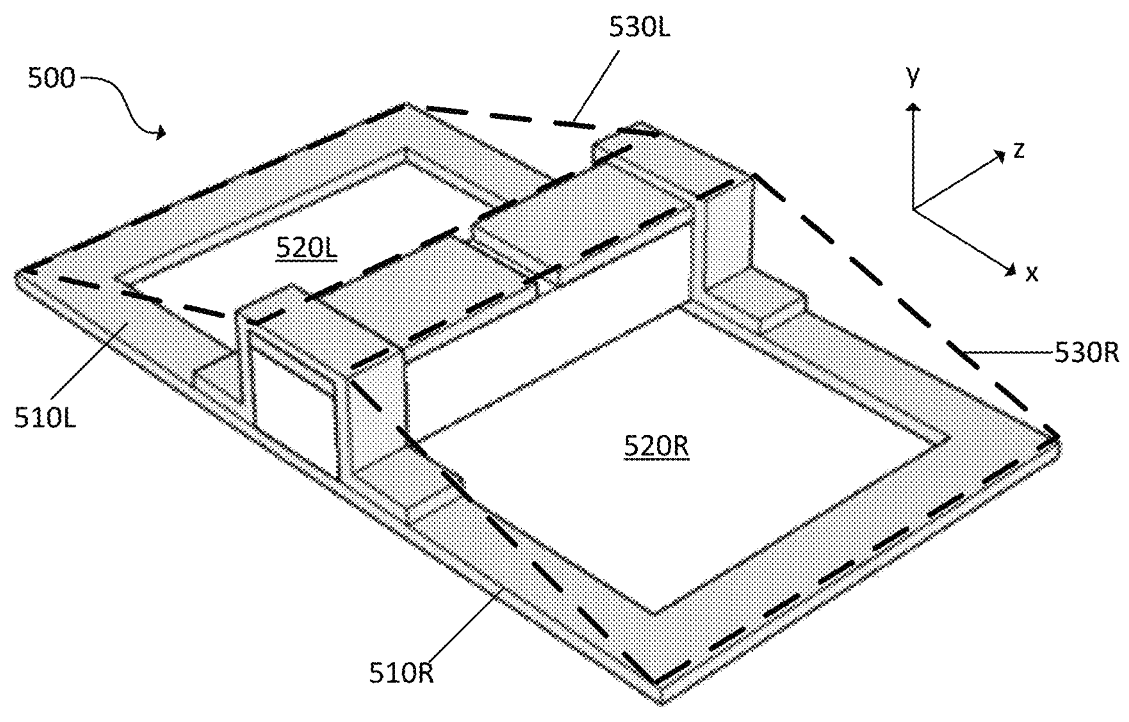
FIGS. 5A to 5C illustrate a third example of a SQUID, configured as a gradiometer, and are respectively a perspective view, plan view, and side view in the yz plane.
Figure 5B:
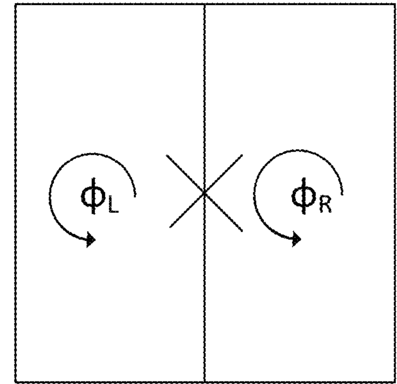
Figure 5C:
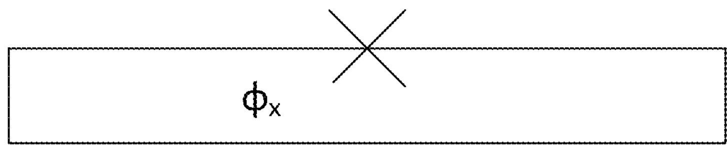

A third example of a SQUID 500 is illustrated in FIGS. 5A to 5C. FIG. 5A shows a perspective view of the SQUID 500. FIG. 3B shows a plan view of the SQUID 500, in the xz plane. FIG. 5C shows a side view of the SQUID 500, in the yz plane.

SQUID 500 is similar to SQUID 300 as described above, differing in that the loop in the xz plane is configured as a gradiometer. The sensitivity of SQUID 500 to a magnetic field in the y-direction may be selected by selecting relative sizes of the loops of the gradiometer. At the same time, sensitivity to magnetic fields in the x-direction is effectively doubled.

A gradiometer comprises a pair of superconductive loops 510L, 510R each enclosing a respective area 520L, 520R. The superconductive loops 510L, 510R which share a central section in common. The basic topology of a gradiometer is described in more detail in e.g. Rev. Sci. Instr. 79, 053704 (2008) and Appl. Phys. Lett. 80, 3638 (2002).

In the present example, the central section comprises a Josephson junction and is spaced vertically from the plane of the substrate, as previously described with reference to FIG. 3.

As shown in FIG. 3B, there is a superconductive loop in the xz plane. However, magnetic flux through one of the superconductive loops cancels the effect of magnetic flux through the other of the superconductive loops. The sensitivity to magnetic flux in the y direction therefore depends upon the difference in the areas 520L, 520R enclosed by the loops 510L, 510R.

Therefore, the sensitivity of SQUID 500 to magnetic flux in the y direction may be controlled by selecting the areas enclosed by loops 510L, 510R. If the areas of the loops 510L, 510R are equal, then the effects of magnetic flux in the y direction may be cancelled out. Compared to vertical SQUID 400, gradiometric SQUID 500 may show lower parasitic capacitance since SQUID 500 does not include two portions of the superconductive loop spaced by a dielectric.

Alternatively, if sensitivity of tuning to magnetic flux in the y direction is desired, then the loops 510L, 510R may be configured to enclose unequal areas.

The effect of applying a magnetic field in the x direction may be understood by considering FIGS. 5A and 5C together. FIG. 5C shows that, when viewed along the x direction, SQUID 500 has a superconductive loop similar to that shown in FIG. 3C.

As a consequence of the gradiometric design, a magnetic field applied in the x direction encounters two such loops, highlighted by dotted lines 530L and 530R in FIG. 5A. The loops together form a tent shape.

Field coming from the x direction penetrates loop 530L, inducing a current in the loop and therefore a phase change over the junction. The field then penetrates loop 530R. The flux through this loop induces a current in the same direction as the current through loop 530L. The total flux in the x direction is the sum of the flux penetrating loop 530L and loop 530R. The two loops can be thought of as approximating a two-turn coil; for a coil, total electromotive force is proportional to the number of turns in the coil.

SQUID 500 is thus tuneable using magnetic flux applied in the x direction, with greater sensitivity compared to the FIG. 3 example, while at the same time having reduced sensitivity to noise due to a magnetic field in the y direction.

The possible modifications described above with reference to SQUID 300 of FIG. 3 are also applicable to the SQUID 500. In particular, the Josephson junction may be electrostatically gated. For example, the Josephson junction may be implemented as shown in FIG. 1.

In some implementations of SQUID 500, a shunt inductance may be coupled to the SQUID to allow for control over the sensitivity of the gradiometric loop to magnetic fields in the y direction.

Figure 6:
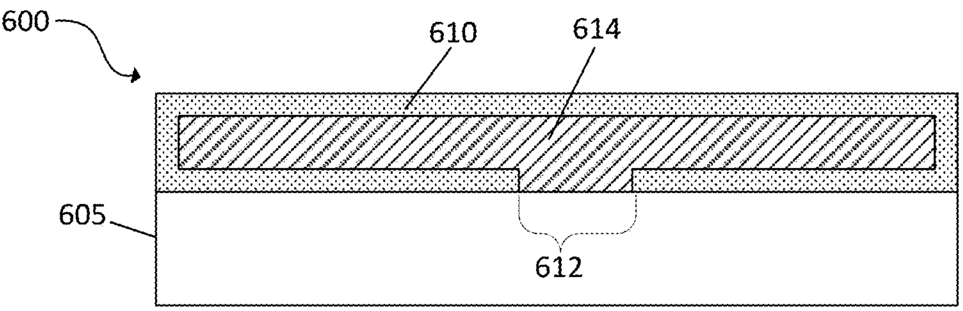
FIG. 6 is a cross-sectional view of a variant of the FIG. 4 device.

FIG. 6 is a cross-sectional view of a further SQUID 600. SQUID 600 is a variant of SQUID 400, differing from SQUID 400 in that the Josephson junction 612 is arranged on the surface of the substrate 605, rather than being suspended above the surface of the substrate 605.

Similar to SQUID 400, SQUID 600 includes a superconductive loop 610 which extends in the vertical direction, to allow for flux tuning of the SQUID by applying a magnetic field parallel to the surface of the substrate 605 and through the loop 610. A portion of dielectric material 614 supports the top part of the loop 610.

This demonstrates that the position of the Josephson junction within the superconductive loop may be selected as desired. It is not essential to space the Josephson junction vertically from the substrate.

The SQUIDs provided herein may be fabricated using any appropriate techniques. Examples include those described in Pita-Vidal et al, "a gate tuneable, field-compatible fluxonium", arXiv:1910.07978v2.

Figure 7:
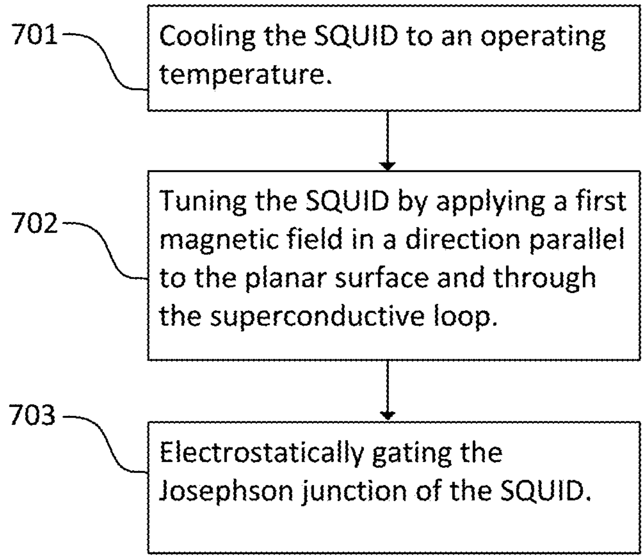
FIG. 7 is a flow chart outlining a method of operating a SQUID.

A method of operating a superconducting quantum interference device will now be explained with reference to the flowchart shown in FIG. 7.

The present method is useful for operating a SQUID which is operably linked to, i.e. inductively coupled to, galvanically connected to, or embedded in, a circuit arranged on a planar surface of a substrate, wherein the SQUID comprises a Josephson junction arranged in a superconductive loop, and wherein the superconductive loop includes a portion which extends perpendicular to the planar surface of the substrate. In particular, the method is useful for operating the SQUIDs of FIGS. 3 to 6.

The method includes, at block 701, cooling the SQUID to an operating temperature using, for example, an appropriate cryogenic chamber. As will be appreciated, the operating temperature is a temperature at or below the critical temperature of the superconducting loop and any superconducting components of the circuit.

At block 702, the SQUID is tuned by applying a first magnetic field in a direction parallel to the planar surface and through the superconductive loop. Since the superconductive loop extends vertically out of the plane of the substrate, tuning using a parallel field is made possible. Using a parallel field as opposed a perpendicular field for tuning may reduce flux noise. For example, a parallel field may not induce unwanted currents in a ground plane of the circuit.

At block 703, an electrostatic field is applied to the Josephson junction using a gate electrode. Using a combination of flux tuning and electrostatic gating may allow for finer control over the behaviour of the junction, and thus, the SQUID.

The use of electrostatic gating is optional. In implementations using electrostatic gating operations 702 and 703 may be performed in any order, or simultaneously.

An example of a circuit 800 in which the SQUID may be used will now be described with reference to the circuit diagrams of FIGS. 8*a* and 8*b*. The example circuit is useful in, for example, circuit quantum electrodynamics investigations into the behaviour of Josephson junctions in strong magnetic fields. The junction modulates an LC resonator inductance which can be probed by looking at the resonator response under different parameter settings of the junction.

Figure 8A:
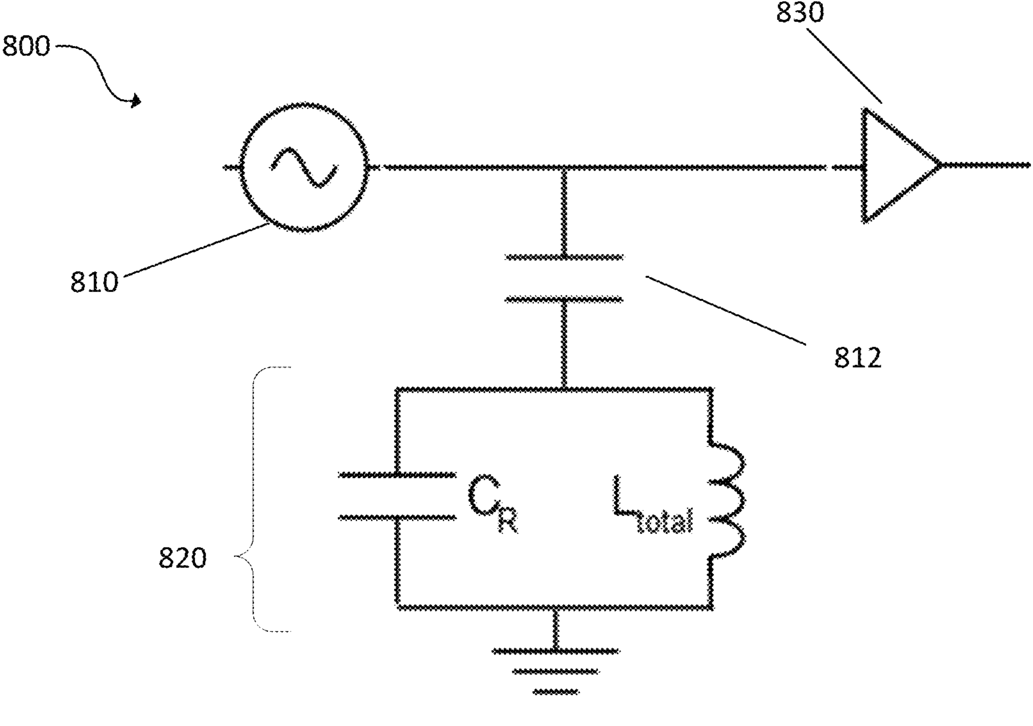
FIG. 8A is a simplified circuit diagram illustrating one example use case for a SQUID.

As shown in FIG. 8*a*, circuit 800 includes a frequency generator 810 which is connected to an LC circuit 820 via a coupling capacitor 812, and to an amplifier 830.

LC circuit 820 comprises a capacitance $C_R$ and an inductance $L_{total}$ connected in parallel. An LC circuit is an electrical resonator which has a resonance frequency which depends upon the magnitude of the capacitance and the inductance in the circuit. The resonance frequency may be calculated using Formula 1:

$$f = \frac{1}{2\pi\sqrt{LC}}$$

where f is the resonance frequency in Hz, L is the inductance in Henry ($kg \cdot m^2 \cdot s^{-2} \cdot A^{-2}$), and C is the capacitance in Farad ($s^4 \cdot A^2 \cdot m^{-2} \cdot kg^{-1}$).

Figure 8B:
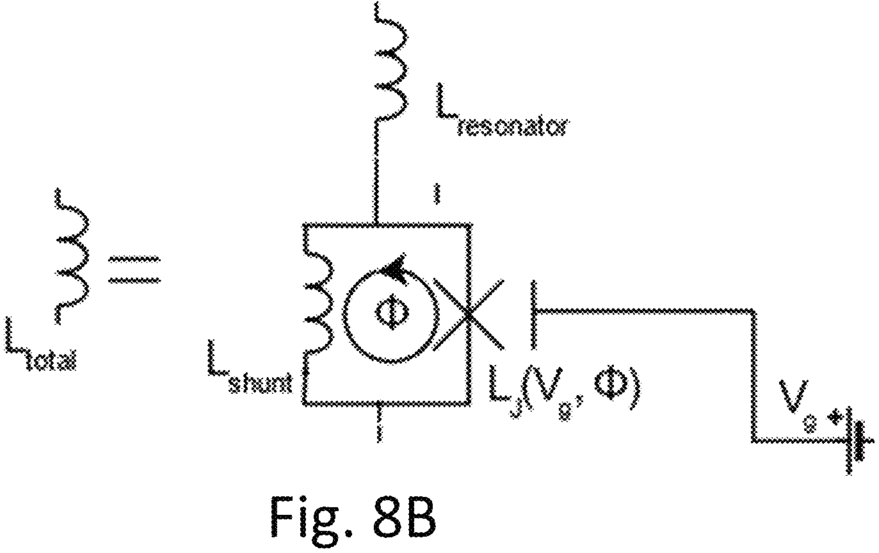
FIG. 8B is a circuit diagram showing details of module $L_{total}$ of FIG. 8A.

FIG. 8B shows in more detail the source of inductance $L_{total}$ in LC circuit 820. The inductance is provided by an inductor $L_{resonator}$ which is connected in series with an electrostatically-gated SQUID. In the limit where the microscopic Andreev bound states inside the junction are far detuned from the resonator frequency, and at zero temperature we can approximate the SQUID to behave as a perfect variable inductor, with an inductance Li that varies as a function of the magnetic flux through the superconductive loop of the SQUID, and also as a function of the gate voltage. A shunt inductance, $L_{shunt}$, is further provided.

The total inductance of the LC resonator of circuit 800 may be described by the equation:

$$L(\phi_E, V_g) = L_R + \frac{1}{L_s^{-1} + L_j^{-1}(\phi_E, V_g)}$$

where $L_R$ is the inductance of inductor $L_{resonator}$; $L_s$ is the inductance of the shunt; $L_j$ is the inductance of the SQUID, $\phi_E$ is the flux through the SQUID, and $V_g$ is the gate voltage applied to the SQUID.

It will be appreciated that the above embodiments have been described by way of example only.

More generally, according to one aspect disclosed herein, there is provided a system comprising a substrate having a planar surface; a first magnet configured to apply a first magnetic field parallel to the planar surface; a circuit arranged on the planar surface; and a superconducting quantum interference device, SQUID, operably linked to the circuit. The SQUID comprises a Josephson junction arranged in a superconductive loop. The superconductive loop includes a portion which extends perpendicular to the planar surface and is orientated such that the SQUID is tuneable using the first magnet. By allowing the SQUID to be tuned using a magnetic field which is parallel to the planar surface, a reduction in flux noise may be achieved.

The SQUID may be embedded in the circuit; galvanically connected to the circuit, e.g. via a transmission line; or may be inductively coupled to the circuit.

The system may further comprise a cryogenic chamber for cooling the SQUID to an operating temperature, i.e. a temperature at which the superconductive loop shows superconductive behaviour. Alternatively, the system may be arrangeable in a cryogenic chamber.

The nature of the circuit is not particularly limited. The described system is useful in any context requiring a flux tunable Josephson junction, for example in the field of circuit quantum electrodynamics.

The circuit may be a superconducting circuit. The circuit may include a superconducting ground plane on the planar surface. Superconducting ground planes may generate flux noise when exposed to a perpendicular field. Avoiding the use of a perpendicular field for tuning may therefore be particularly advantageous when the circuit includes a superconducting ground plane.

The superconducting ground plane may include defect sites configured to trap vortex currents. The defect sites may comprise holes having a diameter selected to be smaller than the diameter of the vortices.

The circuit may be a quantum circuit. The circuit may include a semiconductor-superconductor hybrid device. Examples of quantum circuits are disclosed in e.g. Pita-Vidal et al. arXiv:1910.07978 [cond-mat, physics:quant-ph] (2019); and de Lange, G. et al. Phys. Rev. Lett. 115, 127002 (2015).

The circuit may comprise an LC resonator circuit. The SQUID may be embedded in the LC resonator circuit. In such implementations, the SQUID may provide a variable inductance to the circuit.

The LC circuit may be a component of a qubit device, for example a transmon or flux qubit. In a qubit device, the LC circuit may be coupled to a readout resonator or transmission line; or may be connected in series with a readout resonator and may provide part of the readout resonator inductance. The coupling may be capacitive in the case of a transmon, or inductive in the case of a flux qubit.

The circuit may include a qubit device, in particular qubit devices operated in high external magnetic fields, optionally a topological qubit device or a transmon qubit device. Example qubit devices are disclosed in Luthi, F. et al. Phys. Rev. Lett. 120, 100502 (2018); Bargerbos et al., Phys. Rev. Lett. 124, 246802 (2020); and Kringhøj et al., Phys. Rev. Lett. 124, 246803 (2020). In particular, the qubit device may be a topological box qubit, such as described in Plugge et al, New J. Phys. 19, 012001 (2017).

The circuit may be configured to allow the use of readout techniques for circuit quantum electrodynamics to investigate the physics of Andreev bound states possibly in the topological regime. It is believed that strong magnetic fields may be needed to allow the study of Andreev bound states in the topological regime. See, e.g., Väyrynen et al, Phys. Rev. B 92, 134508 (2015); Janvier et al., Science 349, 1199-1202 (2015); Hays et al., arXiv:1908.02800 [cond-mat, physics:quant-ph] (2019); Hays et al., Phys. Rev. Lett. 121, 047001 (2018); Tosi et al., Phys. Rev. X 9, 011010 (2019).

The first magnet is useful for tuning the behaviour of the SQUID. The first magnet may be configured such that the field strength is variable. The field may include a static, offset component with a field strength in the range 0 to 12 T, and a variable tuning component.

The amount of flux used for tuning may be selected as appropriate depending upon the area enclosed by the superconductive loop perpendicular to the planar surface. As the area increases, the amount of flux for tuning the SQUID decreases. By way of illustration, a variation in field strength of 2 mT may be appropriate for a loop enclosing an area of 1 $\mu m^2$; and a variation in field strength of 1 mT may be appropriate for a loop enclosing 2 $\mu m^2$.

The area enclosed by the loop may be selected as appropriate depending on the use case. The area may be in the range 0.5 to 10000 $\mu m^2$, e.g. 100 to 1000 $\mu m^2$.

The superconductive loop may further comprise a planar gradiometer portion arranged on the planar surface. A planar gradiometer portion comprises a pair of superconducting loop portions arranged on the plane of the substrate. Each loop portion may enclose an equal area of the planar surface. The superconducting loops of the planar gradiometer may each enclose equal areas of the surface of the substrate. This may cancel the effects of a magnetic field applied perpendicular to the substrate.

The superconductive loop may be configured such that the SQUID is sensitive to magnetic fields perpendicular to the substrate. For example, the superconductive loop includes a loop portion in the plane of the substrate. Alternatively, the superconductive loop may comprise a planar gradiometer arranged on the planar surface, comprising a pair of superconducting loop portions which enclose unequal areas of the substrate. Providing unequally-sized loop portions simulates a smaller loop, having an area equal to the difference in area between the two loop portions.

Alternatively, the superconductive loop may be configured such that the tuning of the SQUID is insensitive to magnetic fields perpendicular to the substrate. For example, the superconductive loop may be orientated vertically, without a loop portion in the plane of the substrate; or may comprise a gradiometer in the plane of the substrate configured to cancel the effects of a magnetic field perpendicular to the substrate.

The system may further comprise a second magnet configured to apply a second magnetic field parallel to the planar surface and orthogonal to the first magnetic field. The second magnet may be useful for operating certain components which may be included in the circuit. Depending on the orientation of the superconductive loop, the first magnet and the second magnet may be used together to tune the SQUID.

The system may further comprise, as an alternative or in addition to the second magnet, a third magnet configured to apply a third magnetic field perpendicular to the planar surface. A perpendicular field may be useful for operating certain circuits. In implementations where a perpendicular field is used, the perpendicular field may have a constant field strength when in use. The SQUID may be configured to have reduced sensitivity to the perpendicular field.

The Josephson junction may be arranged on a nanowire. The nanowire may comprise a semiconductor material, such as a material of Formula 1 as described above. Arranging the Josephson junction on a nanowire is one convenient technique for fabricating a superconductive loop includes a portion which extends perpendicular to the planar surface and may also facilitate electrostatic gating of the Josephson junction.

Alternatively, the Josephson junction or a portion of the superconducting loop may be spaced from the planar surface by a layer of a dielectric material.

The system may further comprise at least one gate electrode for electrostatically tuning the Josephson junction. For example, the system may further comprise a plunger gate and a cutter gate. Electrostatic gating provides an additional technique for controlling the behaviour of the Josephson junction.

The SQUID may be a radio frequency, RF, SQUID. An RF SQUID comprises a single Josephson junction arranged in a superconductive loop. The examples described herein used an RF SQUID. However, the principals of the present invention are applicable to any magnetically tuneable device comprising superconducting loop containing a Josephson junction, such as a DC SQUID or a fluxonium, which is a variation of the SQUID structure further comprising a shunt capacitor.

Another aspect provides a method of operating a superconducting quantum interference device, SQUID, wherein the SQUID is operably linked to a circuit arranged on a planar surface of a substrate, wherein the SQUID comprises a Josephson junction arranged in a superconductive loop, and wherein the superconductive loop includes a portion which extends perpendicular to the planar surface, the method comprising: cooling the SQUID to an operating temperature; and tuning the SQUID by applying a first magnetic field in a direction parallel to the planar surface and through the superconductive loop. By using a parallel field to tune the SQUID, the effects of flux noise may be reduced.

The method may be a method of operating a system according to the previous aspect. It will be appreciated that features described with reference to the system are equally applicable in the context of the method.

Tuning the SQUID may further comprise applying an electrostatic field to the Josephson junction using a gate electrode. Using a combination of magnetic and electrostatic tuning may allow for finer control over the behaviour of the SQUID.

The method may further comprise applying a second magnetic field parallel to the planar substrate. The second magnetic field may be orthogonal to the first magnetic field. The second magnetic field may be useful for operating one or more components of the circuit, depending on the implementation.

The method may further comprise applying a further magnetic field perpendicular to the planar substrate. The further magnetic field has a constant field strength. Avoiding variations in the perpendicular field may reduce flux noise, e.g. by avoiding inducing vortex currents or rearrangement currents. Additionally or alternatively, the superconductive loop of the SQUID may be configured such that the tuning of the SQUID is insensitive to a perpendicular magnetic field, as described above with reference to the system. The further magnetic field may be useful for operating one or more components of the circuit.

A still further aspect provides a superconducting quantum interference device, SQUID, wherein the SQUID is arranged on a substrate and comprises: a Josephson junction arranged in a superconductive loop; and a support member having a top surface and a bottom surface; wherein the superconductive loop comprises a bottom portion arranged between a planar surface of the substrate and a bottom surface of the support member, a top portion arranged on a top surface of the support member, and two connecting portions connecting the bottom portion and the top portion, wherein the connecting portions extend in a direction perpendicular to the planar surface of the substrate. The tuning of the SQUID is insensitive to a magnetic field perpendicular to the substrate, because the superconductive loop is orientated vertically with respect to the substrate and there is no loop in the plane of the substrate. This allows for tuning of the SQUID using a magnetic field which is parallel to the substrate.

The SQUID may be operably linked to a circuit arranged on the substrate. The circuit may be any of the circuits described above. For example, the SQUID may be embedded in an LC resonator circuit. The LC resonator circuit may be comprised in a qubit device. The circuit may include a superconducting ground plane.

The nature of the support member is not particularly limited provided that the support member can be penetrated by magnetic flux. For example, the support member may comprise a nanowire or a layer of dielectric material. In some implementations, certain superconducting materials may even be used based on their thickness and type.

The Josephson junction may be arranged in the top portion of the superconductive loop. The Josephson junction may be arranged on the top surface of the support member. Devices configured in this way have been investigated in the examples.

Alternatively, the Josephson junction may be arranged in the bottom portion of the superconductive loop, or one of the connecting portions. The position of the Josephson junction within the superconductive loop is not particularly limited.

The SQUID may be an RF-SQUID, comprising a single Josephson junction arranged in the superconductive loop. Alternatively, the SQUID may be a direct current, DC, SQUID comprising two Josephson junctions arranged in the superconductive loop. The principals presented herein have been described with reference to RF SQUIDs by way of illustration but are also applicable to other types of SQUID.

A still further aspect provides the use of a magnetic field to tune a superconducting quantum interference device, wherein the superconducting quantum interference device is operably linked to a circuit arranged on a planar surface of a substrate, wherein the magnetic field is applied parallel to the planar surface. By using a parallel, as opposed to perpendicular, field to tune the SQUID, the effects of flux noise may be reduced.

EXAMPLE

A gradiometric SQUID of the type illustrated in FIGS. 5A to 5C was fabricated on the surface of a substrate. The central section of the SQUID comprised an electrostatically gated Josephson junction device of the type shown in FIG. 1. The device was arranged in a circuit as described with reference to FIG. 8, and surrounded by a superconductive ground plane.

The circuit was fabricated by sputtering a 22 nm thick layer of NbTiN onto a substrate, and then patterning the LC resonator circuit, transmission lines, gate lines, and gradiometric SQUID loop in a single step using $SF_6$ reactive ion etching. Subsequently, a vapour-liquid-solid grown nanowire having an aluminium shell was transferred to the middle of the gradiometric loop using a nanomanipulator. The Josephson junction was then etched in the aluminium. The aluminium-coated ends of the nanowire were connected to the loop by placing 100 nm NbTiN contacting pads.

The superconductive electrodes comprised a 6 nm thick layer of aluminium. The spacing between the superconductive electrodes of the Josephson junction targeted during fabrication was 80 nm. The spacing in the device as fabricated is believed to have been about 150 nm, due to limitations on the accuracy of the fabrication process.

The dielectric layer was a 28 nm thick layer of $Si_3N_4$, fabricated by plasma enhanced chemical vapour deposition, PECVD.

The nanowire was an indium arsenide nanowire having a diameter of 80±5 nm. The length of the nanowire, spacing one side of the superconductive loop from the other, was 4 μm.

The expected area enclosed by the superconducting loop in the yz plane was thus:

(Length of nanowire)×(nanowire diameter+dielectric layer thickness)=4 μm×(80 nm+28 nm)=0.44 $\mu m^2$ As explained above with reference to FIG. 5, due to the gradiometric design of the device the effective area in the xz plane that causes a phase difference over the junction is doubled to 0.88 $\mu m^2$.

In the present example, it is believed that the effective nanowire diameter was reduced because the nanowire was partially covered by the aluminium. The aluminium layer expels flux due to the Meissner effect. The required field for threading a single flux quantum through the loop was determined by monitoring the period of oscillation of the resonator in response to an applied field, and was found to be 3.3 mT. This is consistent with the effective diameter of the nanowire being smaller than its full diameter. It is estimated that the effective area of the gradiometric SQUID loop was about 0.6 $\mu m^2$.

The gradiometric loop in the xz plane was configured such that the difference in area between the two parts of the gradiometer was 0.77 $\mu m^2$.

Figure 9A:
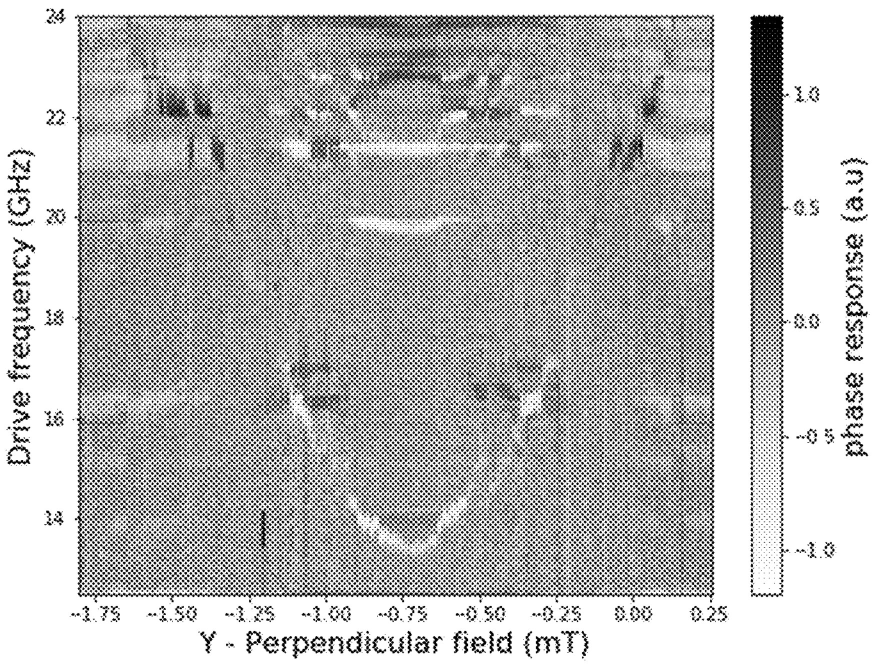
FIG. 9A shows a two-tone spectrogram of a SQUID tuned using a perpendicular field, as discussed in the Example.
Figure 9B:
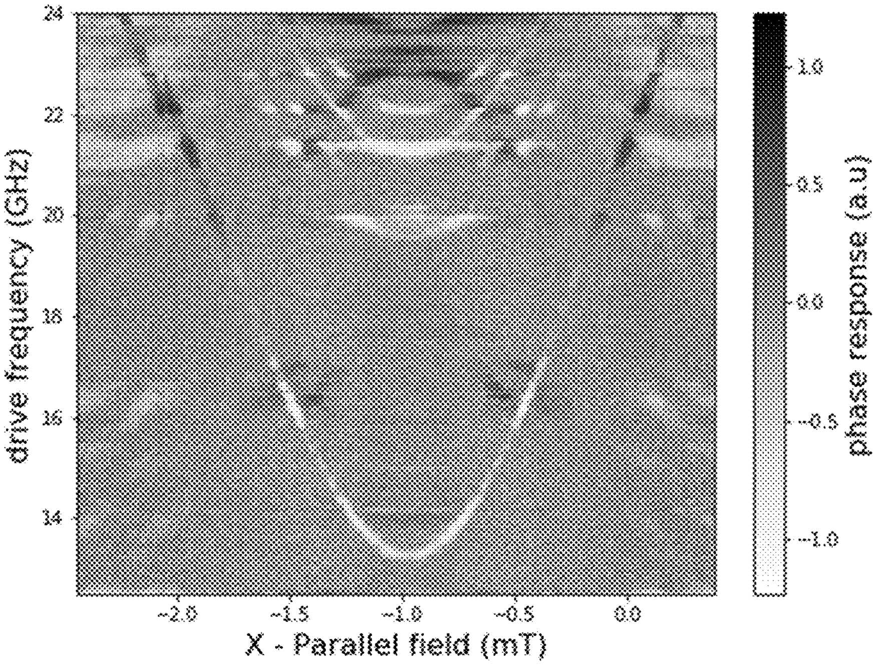
FIG. 9B shows a two-tone spectrogram of a SQUID tuned using a parallel field, and recorded using the same readout settings as for FIG. 9A.

The responses of the SQUID to varying magnetic fluxes applied in the y direction (perpendicular to the substrate) and in the x direction (parallel to the substrate) were investigated using two-tone spectroscopy. The results are shown in FIGS. 9A and 9B. The two spectrographs were generated using identical readout settings (e.g integration time, gate voltage, etc) and an equal field resolution of 10 μT.

Two-tone spectroscopy provides a representation of energy levels in the investigated system. The relevant portion of the spectrographs shown in FIGS. 9A and 9B is the generally U-shaped trace towards the middle of the spectrograph. This trace shows the transition energy between the ground state and the excited state of an Andreev doublet.

FIG. 9A shows the effect of tuning the SQUID using a magnetic flux applied in the y direction. As may be seen, a noisy central trace was obtained. This illustrates that the device generated a relatively large amount of flux noise when tuned using a perpendicular magnetic field.

FIG. 9B shows the effect of tuning the SQUID using a magnetic flux applied in the x direction. The central trace is substantially smoother than that shown in FIG. 9B, showing that a reduction in flux noise is achieved when using a parallel field for flux tuning.

Figure 10A:
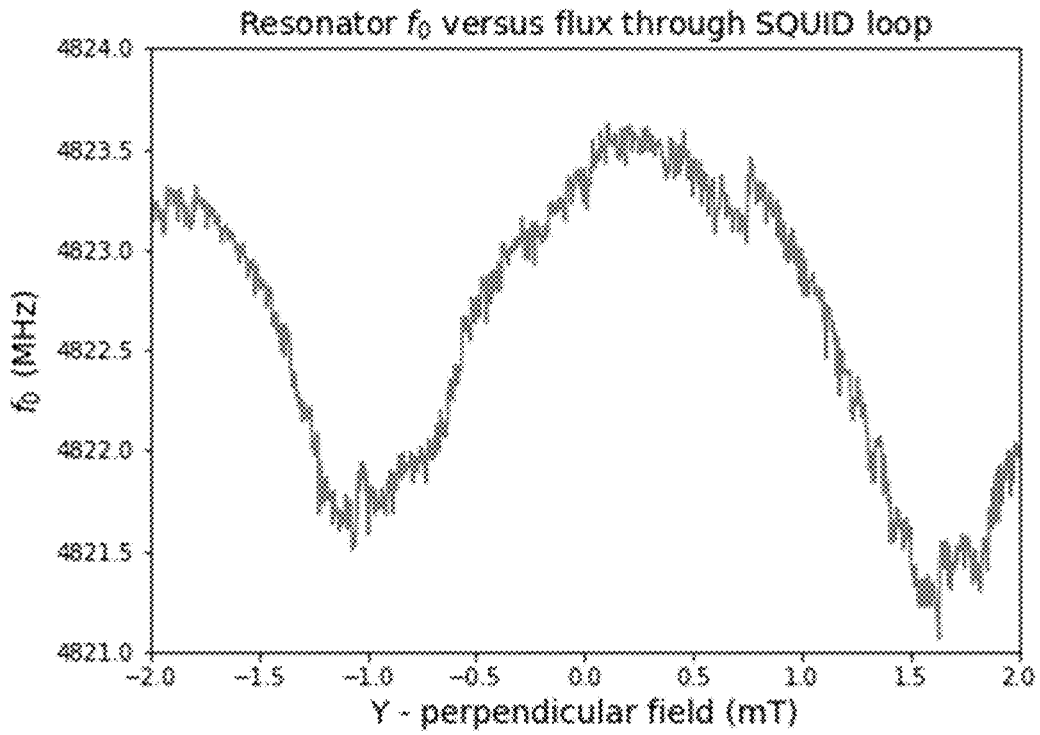
FIG. 10A is a plot showing the frequency response of the LC resonator circuit investigated in the Example to a magnetic field applied perpendicular to the plane of the substrate.
Figure 10B:
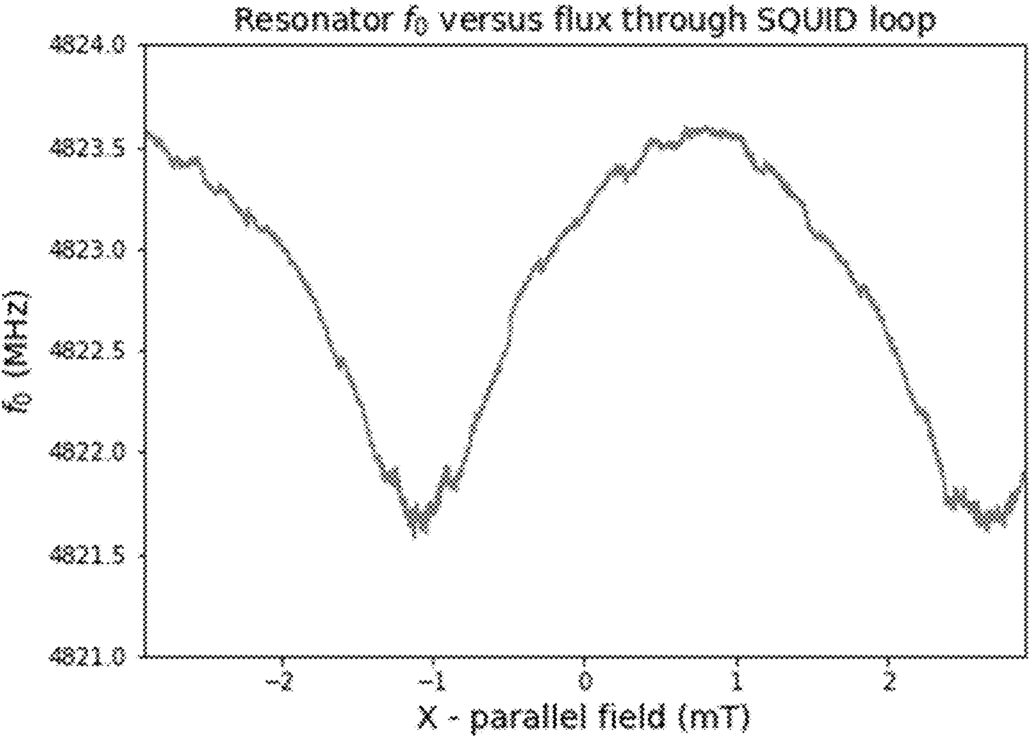
FIG. 10B is a plot showing the frequency response of the LC resonator circuit investigated in the Example to a magnetic field applied parallel to the plane of the substrate.

Measurements of resonator frequency as a function of applied flux in the parallel (x) and perpendicular (y) directions were also performed. The results are shown in FIGS. 10A and 10B, with FIG. 10A showing the effects of the perpendicular field, and FIG. 10B showing the results of the parallel field. As may be seen by inspection of the plots, less noise was observed when applying the parallel field compared to the perpendicular field.

Other variants or use cases of the disclosed techniques may become apparent to the person skilled in the art once given the disclosure herein. The scope of the disclosure is not limited by the described embodiments but only by the accompanying claims.

The invention claimed is:

1. A system comprising:
a substrate having a planar surface;
a first magnet configured to apply a first magnetic field parallel to the planar surface;
a circuit arranged on the planar surface; and
a superconducting quantum interference device, SQUID, operably linked to the circuit,
wherein the SQUID comprises a Josephson junction arranged in a superconductive loop; and
wherein the superconductive loop includes a portion which extends perpendicular to the planar surface and is orientated such that the SQUID is tuneable by the first magnet.

2. The system according to claim 1, wherein the circuit includes a superconducting ground plane on the planar surface.

3. The system according to claim 1, wherein the superconductive loop further comprises a planar gradiometer portion arranged on the planar surface.

4. The system according to claim 3, wherein the planar gradiometer comprises two loop portions each enclosing respective areas of the planar surface, wherein the respective areas are equal.

5. The system according to claim 3, wherein the planar gradiometer comprises two loop portions each enclosing respective areas of the planar surface, wherein the respective areas are unequal.

6. The system according to claim 1, wherein the superconductive loop is configured to be insensitive to a magnetic field perpendicular to the planar surface.

7. The system according to claim 1, further comprising a second magnet configured to apply a second magnetic field parallel to the planar surface and orthogonal to the first magnetic field.

8. The system according to claim 7, further comprising a third magnet configured to apply a third magnetic field perpendicular to the planar surface.

9. The system according to claim 1, wherein the Josephson junction is arranged on a nanowire.

10. The system according to claim 1, further comprising at least one gate electrode for electrostatically gating the Josephson junction.

11. The system according to claim 1, wherein the SQUID is a radio frequency SQUID.

12. The system according to claim 1, wherein the circuit includes a qubit device.

13. A method of operating a superconducting quantum interference device, SQUID, wherein the SQUID is operably linked to a circuit arranged on a planar surface of a substrate, wherein the SQUID comprises a Josephson junction arranged in a superconductive loop, and wherein the superconductive loop includes a portion which extends perpendicular to the planar surface, the method comprising:

cooling the SQUID to an operating temperature; and tuning the SQUID by applying a first magnetic field in a direction parallel to the planar surface and through the superconductive loop.

14. The method according to claim 13, further comprising electrostatically gating the SQUID by applying an electrostatic field to the Josephson junction using a gate electrode.

15. The method according to claim 13, wherein the method further comprises applying a second magnetic field parallel to the planar surface.

16. The method according to claim 13, wherein the method further comprises applying a further magnetic field perpendicular to the planar surface.

17. A superconducting quantum interference device, SQUID, wherein the SQUID is arranged on a substrate and comprises:

a Josephson junction arranged in a superconductive loop; and a support member having a top surface and a bottom surface;

wherein the superconductive loop comprises a bottom portion arranged between a planar surface of the substrate and a bottom surface of the support member, a top portion arranged on a top surface of the support member, and two connecting portions connecting the bottom portion and the top portion, wherein the connecting portions extend in a direction perpendicular to the planar surface of the substrate.

18. The SQUID according to claim 17, wherein the support member comprises a nanowire or a layer of dielectric material.

19. The SQUID according to claim 17, wherein the Josephson junction is arranged in the top portion of the superconductive loop.

20. The SQUID according to claim 17, wherein the Josephson junction is arranged in the bottom portion of the superconductive loop.

* * * * *